United States Patent
Krahn et al.

(10) Patent No.: US 7,436,181 B2
(45) Date of Patent: Oct. 14, 2008

(54) PROBE HEAD FOR NUCLEAR MAGNETIC RESONANCE MEASUREMENTS

(76) Inventors: Alexander Krahn, Wilhelmstrasse 36, Karlsruhe (DE) D-76137; Peter Hoefer, Annette-von-Droste-Huelstoff-Weg 11, Ettlingen (DE) D-76275; Frank Engelke, Franz-Allgaier-Strasse 9, Rheinstetten (DE) D-76287

(*) Notice: Subject to any disclaimer, the term of this patent is extended or adjusted under 35 U.S.C. 154(b) by 0 days.

(21) Appl. No.: 11/494,265

(22) Filed: Jul. 27, 2006

(65) Prior Publication Data
US 2007/0030005 A1 Feb. 8, 2007

(30) Foreign Application Priority Data
Aug. 4, 2005 (GB) .................. 10 2005 039 087

(51) Int. Cl.
*G01V 3/00* (2006.01)
(52) U.S. Cl. ........................ 324/321; 324/318
(58) Field of Classification Search ......... 324/300–322; 600/407–445
See application file for complete search history.

(56) References Cited

U.S. PATENT DOCUMENTS

| | | | |
|---|---|---|---|
| 4,437,063 A | 3/1984 | Biehl et al. | |
| 4,446,429 A | 5/1984 | Froncisz et al. | |
| 5,160,890 A * | 11/1992 | Roschmann | 324/314 |
| 5,298,864 A | 3/1994 | Müller et al. | |
| 5,345,203 A | 9/1994 | Gentsch et al. | |
| 5,744,957 A | 4/1998 | Vaughan, Jr. et al. | |
| 5,760,586 A | 6/1998 | Foerster et al. | |
| 5,781,011 A | 7/1998 | Scholes et al. | |
| 6,538,444 B2 * | 3/2003 | Gerald et al. | 324/318 |
| 6,720,769 B2 * | 4/2004 | Gerald et al. | 324/318 |
| 2003/0052678 A1 | 3/2003 | Gerald, II et al. | |

FOREIGN PATENT DOCUMENTS

| | | |
|---|---|---|
| DE | 03 29 754 C2 | 3/1882 |
| DE | 44 42 742 C1 | 5/1998 |
| EP | 0 483 228 B1 | 5/1992 |
| GB | 41 25 655 C2 | 2/1993 |
| JP | 2006-98188 | 4/2006 |

OTHER PUBLICATIONS

Höfer, Peter, "Bruker's Dielectric Resonator for FT-EPR", Report, Feb 1989, pp. 4-6.
Biehl, R. "Sensitivity enhancement in EPR—The dielectric ring TE 011 cavity", Bruker Report, Jan. 1986, pp. 45-47.

* cited by examiner

Primary Examiner—Brij B Shrivastav

(57) ABSTRACT

A probe head for nuclear magnetic resonance measurements comprises a sample holder having a stator and a rotor. The rotor is journalled for rotation about an axis of rotation within the stator. It is adapted for receiving a sample substance. The axis of rotation is inclined by an angle with respect to a longitudinal axis of the probe head. The stator is configured as a dielectric resonator.

24 Claims, 4 Drawing Sheets

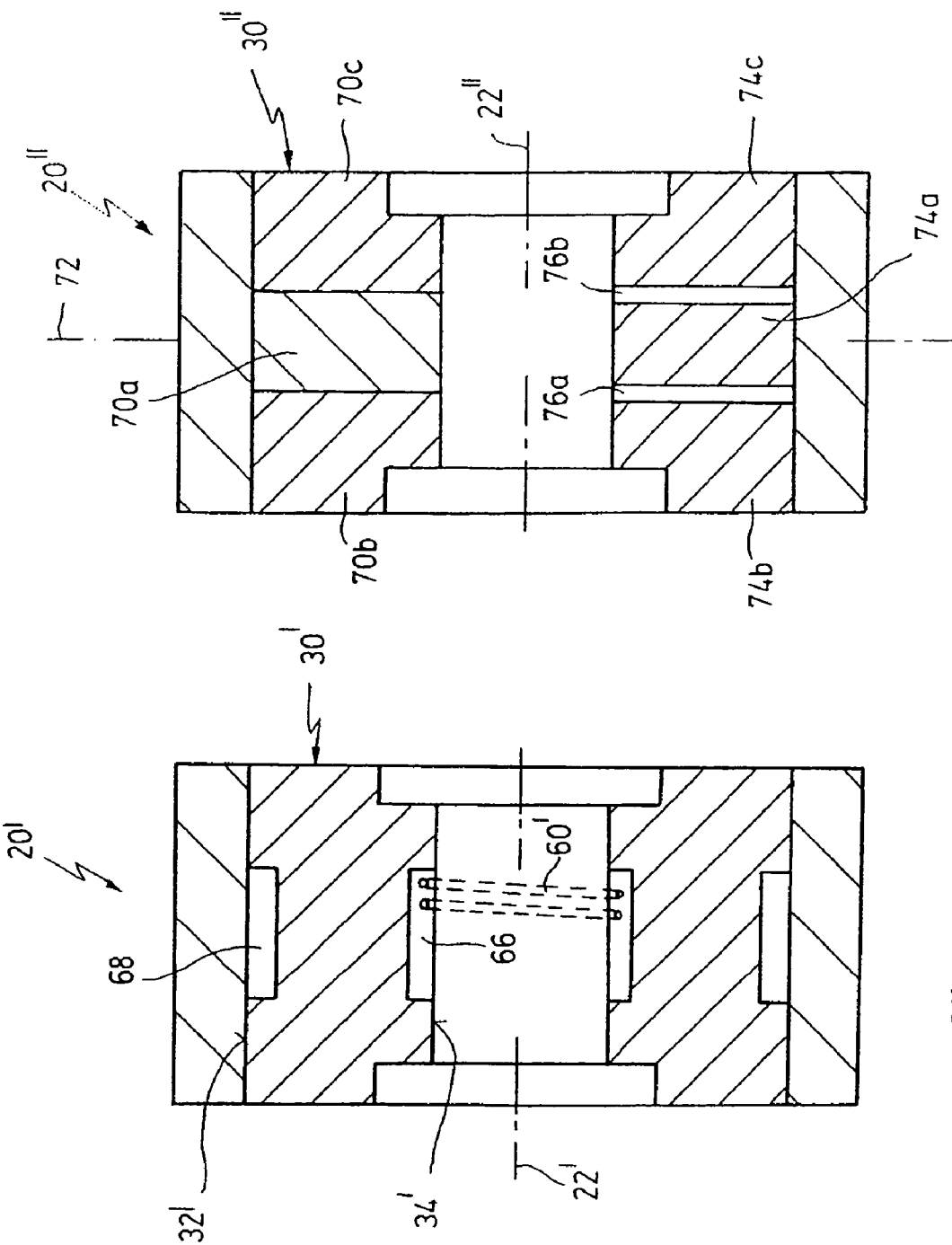

PROBE HEAD FOR NUCLEAR MAGNETIC RESONANCE MEASUREMENTS

RELATED APPLICATIONS

The present application claims priority of German patent application 10 2005 039 087.0 filed on Aug. 4, 2005.

FIELD OF THE INVENTION

The present invention is related to the field of magnetic resonance.

More specifically, the invention is related to the field of nuclear magnetic resonance probe heads.

Still more specifically, the invention is related to a probe head for nuclear magnetic resonance measurements, comprising a sample holder having a stator and a rotor, the rotor being journalled for rotation about an axis of rotation within the stator and being adapted for receiving a sample substance, the axis of rotation being inclined by an angle with respect to a longitudinal axis of the probe head.

BACKGROUND OF THE INVENTION

A probe head of the afore-mentioned kind is disclosed in EP 0 483 228 B1 (U.S. Pat. No. 5,298,864) and in DE 44 42 742 C1 (U.S. Pat. No. 5,760,586).

In the field of nuclear magnetic resonance measurements (NMR) it is well known to let the sample under investigation rotate, and to arrange same in an orientation relative to the constant magnetic field ($B_0$) which, instead of the conventional 90°, is inclined under the so-called "magic angle" of 54.7°. This type of measurement method is conventionally identified as "magic angle spinning" (MAS).

In prior art MAS setups of the type specified at the outset, for exciting a nuclear resonance, a high frequency magnetic field ($B_1$) of a frequency in the range of at most 300 to 400 MHz is used, which, for protons ($^1H$) corresponds to a constant magnetic field ($B_0$) of between 7 and 9.4 T. For that purpose, solenoid coils are used, being arranged within the stator and coaxially surrounding the rotor. The solenoid coil generates the high frequency magnetic field ($B_1$) required for the NMR measurement, and, simultaneously, serves as a receiving coil for the nuclear resonance signal of even frequency generated by the sample substance.

Due to progress in the field of magnet design, however, it has become conventional in the meantime to generate constant magnetic fields ($B_0$) with a field strength in the area of up to 22 T, which, for protons ($^1H$) corresponds to a resonance frequency of about 940 MHz.

In this frequency range, solenoid coils are difficult to handle, because their dimensions become too small, so that no sufficient high frequency field strength ($B_1$) may be generated, and, further, they may hardly be tuned. Moreover, for such high frequencies, the areas of the high frequency electrical and the high frequency magnetic fields more and more overlap in solenoid coils, such that an increasing portion of the sample substance is located in the area of the high frequency electrical field. This, in turn, results in high dielectric losses, not only for solid samples but in particular for liquid and for electrically conductive, for example salt-containing samples, all of which results in a deterioration of the quality factor of the resonance structure, which, in turn, worsens the measuring sensitivity. In probe heads with MAS function, these circumstances present problems already in the frequency range above 750 MHz (17.6 T).

In the field of electron spin resonance spectroscopy (ESR), various resonance structures are known for the microwave frequencies used therein, in particular within the X-band (about 9 to 12 GHz). Besides the conventionally used hollow cavity resonators, also so-called "split-ring" resonators are used in the field of ESR, as, for example, described in U.S. Pat. Nos. 4,446,429 and 5,744,957. Apart from that, it is also known in the art of ESR to use dielectric resonators, made from sapphire, such as described in an article described by Biehl, R. "Sensitivity enhancement in EPR—The dielectric ring TE 011 cavity", Bruker Report, 1/1986, pp. 45-47, as well as in DE 30 29 754 C2 (U.S. Pat. No. 4,437,063), and in DE 41 25 655 C2 (U.S. Pat. No. 5,345,203). With all these prior art arrangements, the particularly described resonance structure exclusively has the function to configure an electrically substitute for conventional hollow cavity resonators. Further functions, in particular mechanical auxiliary functions, are not provided.

U.S. 2003/0052678 A1 discloses an NMR probe head for being used within an ultracentrifuge. The set up comprises a hollow cylindrical stator consisting of an electrically conductive, however non-magnetic material. A rotor is contained within the stator, the rotor being made from an electrically non-conductive and non-magnetic material. An electrical conductor extends along the central axis of the cylindrical stator. The sample is positioned within the rotor. The stator and the electrical conductor, together, generate the high frequency magnetic field as required for exciting the nuclear resonance. The rotor containing the sample rotates within the stator and is journalled therein by means of an air bearing generated between the stator and the rotor.

SUMMARY OF THE INVENTION

It is, therefore, an object underlying the invention to improve an MAS probe head of the type specified at the outset, such that the afore-mentioned disadvantages are avoided. In particular, the probe head shall be adapted to be operated at high frequencies of above 750 MHz, i.e. it shall have sufficient dimensions for receiving a sample, shall generate sufficiently strong high frequency magnetic field ($B_1$), and shall be simple to tune. Moreover, the electrical field within the sample volume shall be as small as possible, such that the above-mentioned losses within the sample are likewise as small as possible.

In a probe head of the type specified at the outset, this object is achieved by the invention, in that the stator is configured as a dielectric resonator.

The object underlying the invention is, thus, entirely solved.

For, the invention does not only take advantage of the properties of a dielectric resonator as a resonance structure, instead it uses the resonator also as a mechanical component because it allots to it the function of the stator. By doing so, it is possible to design a particularly compact probe head, which, for MAS probe heads is not trivial due to the inclined arrangement of stator and rotor.

A dielectric resonator that is operated in the $TE_{01}$ mode of oscillation is characterized by an essentially improved spatial separation between the electrical high frequency fields which are unwanted in the present context, and the magnetic high frequency field that is wanted. Therefore, the dielectric losses, in particular for liquid and for salt-containing samples, are smaller which, in turn, improves the quality factor resonance structure, and the measurement sensitivity.

In a preferred embodiment of the invention, the dielectric resonator has essentially the shape of a hollow cylinder, the axis of which coinciding with the longitudinal axis.

This measure has the advantage, that the high frequency function and the mechanical function may be united with a minimum spatial requirement.

Insofar, preferably, the rotor has an essentially cylindrical rotational body extending along the axis of rotation, and being provided with an axial recess for receiving a sample arrangement.

This measure, too, has the advantage that the spatial requirement is at a minimum, because the sample is located directly adjacent the rotor.

In that case, the sample arrangement may be a sample container containing a sample substance, or may be the sample substance itself.

In another preferred embodiment of the invention, the rotor has two turbine plates arranged along the axis of rotation with a distance between one another, the turbine plates being journalled within the dielectric resonator, and means being provided for feeding a bearing and driving gas to the turbine plates.

This measure has the advantage, that the rotor may be driven and may be journalled within the stator with a minimum of means and with minimum spatial requirements.

The turbine plates, preferably, are embedded in front surfaces of the hollow cylinder.

Moreover, a particularly good effect is achieved when means are provided for setting a resonance frequency of the dielectric resonator. These means, preferably, are configured as electrically conductive plates being adapted to be shifted along the front surfaces of the hollow cylinder relative to the axis of rotation.

This measure has the advantage, that the resonance frequency of the resonator may be set in a simple way. With the preferred arrangement described before, using shiftable conductive plates, the resonance frequency of the resonator may, for example, be increased from a basic frequency of 700 MHz by about 50 MHz up to 750 MHz through shifting the plates by the front surfaces, such that a higher effective resonance and operational frequency may be achieved with comparable dimensions.

When the sample substance contains a first kind of nuclei ($^1$H) having a first nuclear resonance frequency (X) equal to the resonance frequency of the dielectric resonator, preferably at least one transmitter/receiver unit may be provided in the stator for irradiating a high frequency magnetic field of a second frequency equal to a second nuclear resonance frequency (Y) of a second kind of nuclei ($^{13}$C, $^{15}$N, $^{31}$P) being likewise contained in the sample substance.

This measure has the advantage, that the probe head according to the invention allows to conduct multiple resonance measurements, in which, for example, one kind of nuclei may be saturated and the kind of nuclei may be observed, as is known per se.

In this context, it is preferred when the transmitter/receiver unit is configured as a solenoid coil, the axis of which coinciding with the axis of rotation. This design, too, contributes to the compactness of the design.

In a first variant of the afore-mentioned embodiment of the invention, the solenoid coil is arranged in an interior space of the hollow cavity, whereas according to a second variant, it is arranged in an inner recess applied to an inner peripheral surface of the hollow cylinder.

These measurements have the advantage that the one or, as the case may be, the several solenoid coils for exciting a second, and, as the case may be, still a third kind of nuclei, may be housed in a compact manner, depending on the particular design.

In the context of the present invention, various measures may be used for homogenizing the high frequency magnetic field ($B_1$).

According to a first variant, an inner recess is applied to an inner peripheral surface of the hollow cylinder, according to a second variant, an outer recess is applied to an outer peripheral surface of the hollow cylinder, wherein in a common refinement of these variants, the inner and the outer recesses may be arranged flush one with the other.

This measure has the advantage, that by such a specific shape of the resonator body, namely by a reduction in cross section of the hollow cylinder within the central area, a homogenization of the $B_1$ field takes place because the alignment of the field lines becomes more homogeneous and more parallel.

A corresponding effect may be achieved according to a third variant, in which the stator is configured in layers along the axis of rotation, the layers being made of materials of different relative dielectric constants ($\in_r$), or according to a third variant in which layers are arranged one besides the other, the layers consisting of dielectric materials, and of air.

This measure has the advantage, that a homogenization of the $B_1$ field takes place through an intended spatial distribution of the dielectricity.

This holds true in particular when the stator is configured dielectrically symmetric to both sides starting from a radial median plane positioned at half of its length.

In preferred embodiments of the invention, the dielectric resonator is made from a ceramic material having a relative dielectric constant ($\in_r$) of more than 150, in particular of more than 400.

For that purpose, the ceramic material is, preferably, selected from the family of titanates, and, in particular, is barium titanate or strontium titanate.

These dielectricity values and material have shown to be particularly useful during experiments, for making a dielectric resonator for applications in the above-mentioned frequency range of interest.

Further advantages will become apparent from the description and the enclosed drawing.

It goes without saying that the features mentioned before and those that will be explained hereinafter may not only be used in the particularly given combination, but also in other combinations, or alone, without leaving the scope of the present invention.

BRIEF DESCRIPTION OF THE DRAWINGS

The above and further advantages of the invention may be better understood by referring to the following description in conjunction with the accompanying drawings in which:

FIG. 4 on a reduced scale shows a first variant of a stator, as shown in FIG. 2; and FIG. 5 shows a second variant thereof.

DETAILED DESCRIPTION

Figure 1:
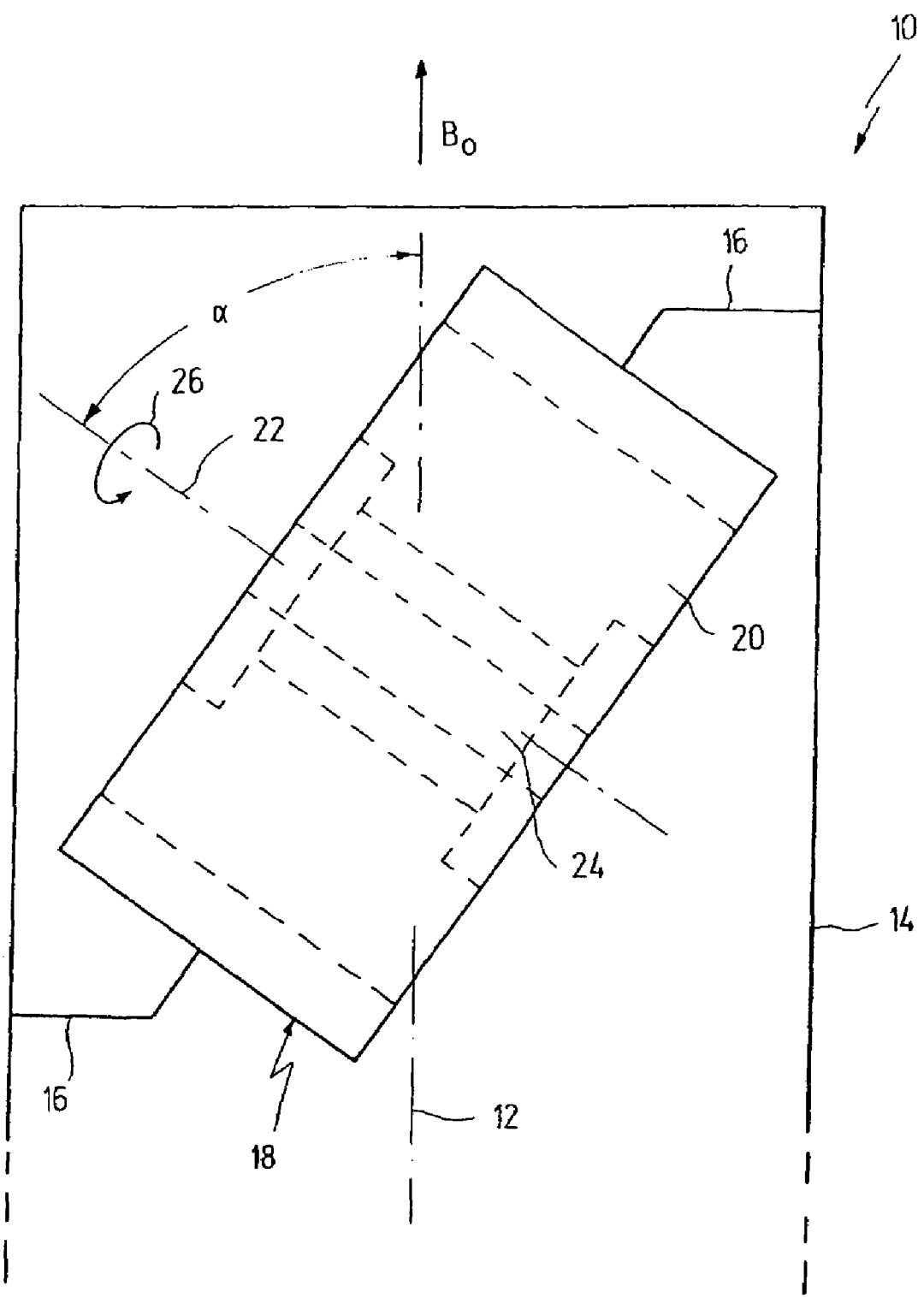
FIG. 1 shows a highly schematic side-elevational view of an embodiment of a probe head according to the present invention.

In FIG. 1, reference numeral 10 as a whole designates a probe head, as may be used for nuclear resonance measurements. Probe head 10 is of essentially cylindrical shape and has a longitudinal axis 12. Probe head 10 is surrounded by a housing 14 and may be inserted into a bore of a superconducting magnet. When doing so, longitudinal axis 12 coincides with the direction of constant magnetic field $B_0$. By means of mounting elements 16, a sample holder 18 is attached to housing 14 or on a supporting structure of probe head 10. Sample holder 18 contains a stator 20 as well as a rotor 24 being journalled within stator 20 for rotation about an axis of rotation 22. The rotation of rotor 24 about axis of rotation 22 is indicated by an arrow 26.

Axis of rotation 22 is inclined relative to longitudinal axis 12, and, hence, also relative to the direction of constant magnetic field $B_0$ by an angle $\alpha$. Angle $\alpha$ is the so-called "magic angle" and amounts to 54.7°.

Figure 2:
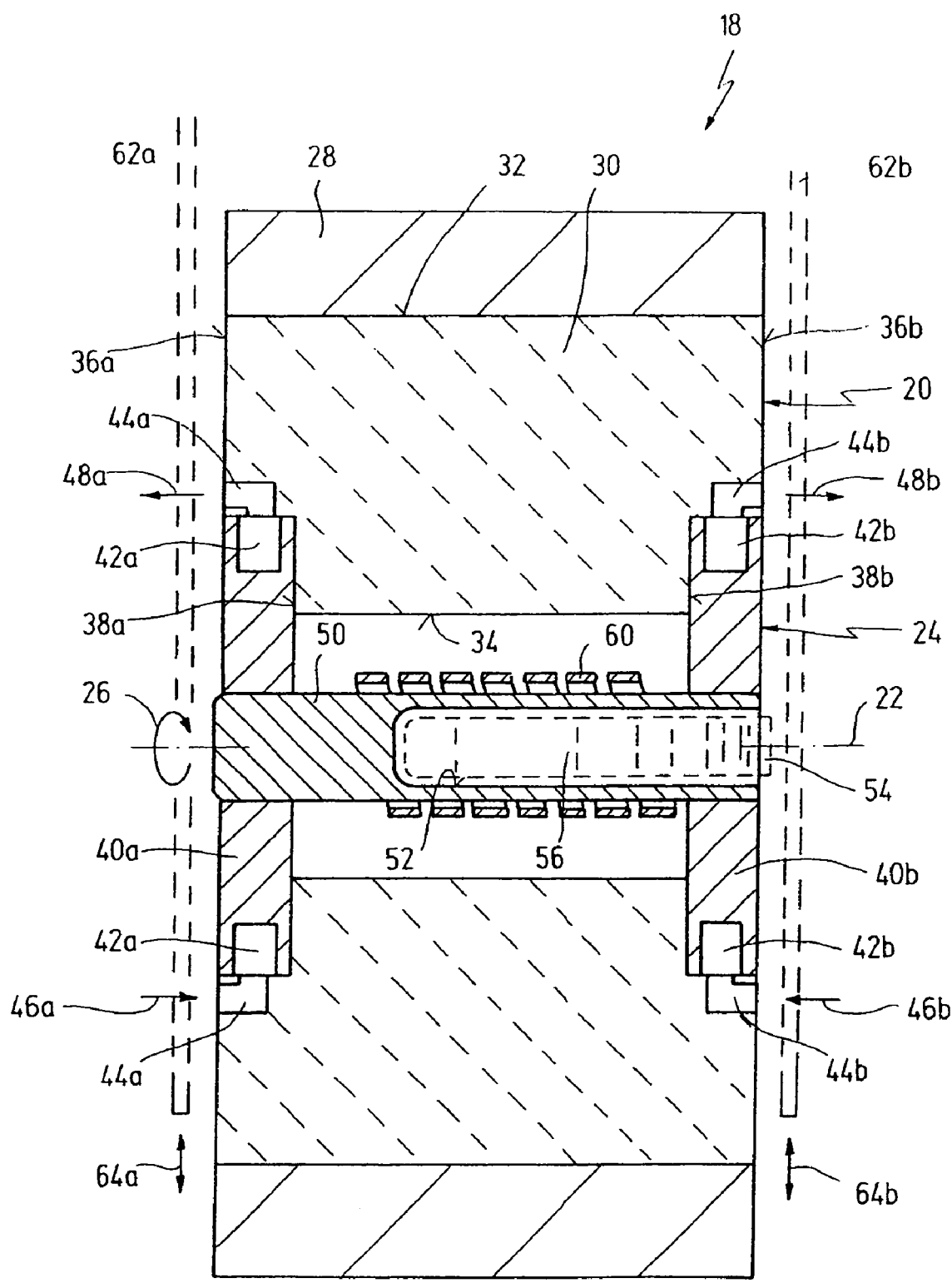
FIG. 2 on an enlarged scale shows a cross-sectional illustration of a sample holder as may be used in the probe head of FIG. 1.
Figure 3:
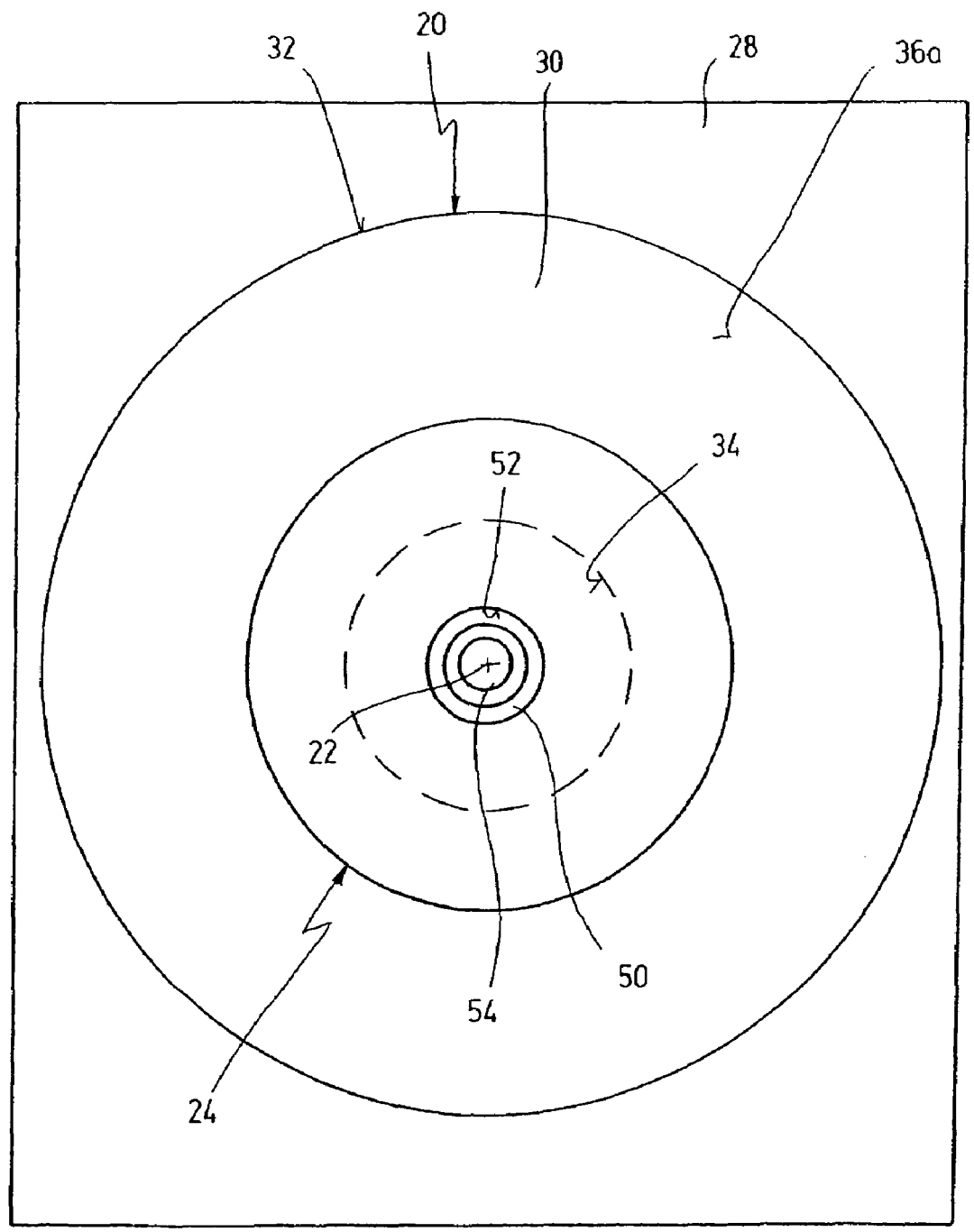
FIG. 3 shows a view of the sample holder of FIG. 2 along its axis.

In FIGS. 2 and 3, further details of sample holder 18 are shown on an enlarged scale.

An essentially annular mount 28 surrounds and supports a hollow cylinder 30 having an outer peripheral surface 32, an inner peripheral surface 34, as well as front surfaces 36a and 36b, respectively, on both ends.

Hollow cylinder 30 consists of a material of a high relative dielectric constant $\in_r$. For that material, ceramics may be taken into account, as are also used for the manufacture of capacitors, for example from the family of titanates, in particular barium titanate or strontium titanate. With such materials, relative dielectric constants $\in_r$ of 150 (barium titanate) up to above 450 may be obtained.

A hollow cylinder made from such a material is a dielectric resonator, the resonance frequency of which may be determined from its dimensions, and from the relative dielectric constant $\in_r$ of the particularly used material. The resonance frequency is selected such that it is essentially equal to the resonance frequency of a first kind of nuclei that shall be measured with the probe head 10 according to the invention, in particular protons ($^1$H).

It is well known to a person of ordinary skill to couple the dielectric resonator, for example inductively, via a loop arranged in its direct vicinity. Therefore, the coupling need not be illustrated.

Cylindrical recesses 38a, 38b are provided within front surfaces 36a and 36b. Turbine plates 40a and 40b are inserted into recesses 36a and 36b. Turbine plates 40a and 40b are provided with turbine surfaces 42a and 42b at their periphery. Channels 44a and 44b are directed within hollow cylinder 30 towards turbine surfaces 42a and 42b. Channels 44a and 44b are connected to feeding ducts (46a and 46b) and to draining ducts (48a and 48b), respectively, for a bearing and driving gas, for example air or nitrogen. Channels 44a and 44b are configured within hollow cylinder 30 as short as possible, in order not to interfere with the propagation of the high frequency fields. It is also possible to supply turbine surfaces 42a and 42b with driving gas from outside.

Turbine plates 40a and 40b are seated non-rotationally at the ends of an essentially cylindrical rotational body 50. Rotational body 50 has a central and axial recess 52 that is accessible from at least one side. A sample container 54 containing a sample substance 56 may be inserted into recess 52. However, sample substance 56 may also be directly filled into recess 52.

A solenoid coil 60 is arranged to surround rotational body 50. It serves as a high frequency transmitting and receiving coil and is operated with a signal of a frequency corresponding to the resonance frequency of a second kind of nuclei which also takes part in the measurements with the probe head 10 according to the invention. The second kind of nuclei is, preferably, $^{13}$C, $^{15}$N or $^{31}$P.

Two electrically conductive plates 62a and 62b are used for tuning the frequency of the dielectric resonator. Plates 62a and 62b are arranged parallel and adjacent to front surfaces 36a and 36b and are adapted to be shifted relatively thereto, for example perpendicular to the axis of rotation 22, as indicated by arrows 64a and 64b. If, for example, the dielectric resonator of FIGS. 2 and 3 is designed to operate at a basic frequency of 700 MHz, then the shifting of plates 62a and 62b effects an increase of that frequency by about 50 MHz to 750 MHz.

For conducting the measurement, sample container 54 with sample substance 56 is inserted into recess 52 of rotational body 50. Probe head 10 is then inserted into the magnet. Now, the bearing and driving gas is guided onto turbine surfaces 42a and 42b, such that rotor 24 rotates stator 20. The electrical matching is effected by correspondingly coupling the high frequency signal to the dielectric resonator by tuning the frequency by means of plates 62a and 62b.

Within hollow cylinder 30 of the dielectric resonator, a high frequency electrical field is now generated, having field lines extending about rotational axis 22, namely in the toric area between outer peripheral surface 32 and inner peripheral surface 34 of hollow cylinder 30, i.e. where there is no sample substance 56. High frequency magnetic field $B_1$, in contrast, forms field lines which actually penetrate rotational body 50 and, hence, also sample substance 56 to close thereafter within the exterior space. Thereby, the field strength of high frequency magnetic field B1 is homogeneous and at a maximum at the position of sample substance 56.

In order to still improve the homogeneity of high frequency magnetic field B1, one may proceed in various ways, illustrated in FIGS. 4 and 5, where like elements are designated by like reference numerals, whereas modified elements are designated by adding an apostrophe to the particular reference numeral.

All these approaches have in common that the slightly curved extension of the magnetic field lines in the area of sample substance 56 is linearized, and the distribution density of the field lines is homogenized.

In the embodiment of FIG. 4, this is effected on the one hand in that inner peripheral surface 34' has a recess 66, for example an annular groove applied thereto. On the other hand, one can, as an alternative or in addition, provide outer recess 68 to outer peripheral surface 32'. If both recesses 66 and 68 are provided, they may be arranged flush with one another, however, also other arrangements are likewise possible. The intended homogenization of the high frequency magnetic field $B_1$ is achieved by weakening the material of hollow cylinder 30' in its central area.

If inner recess 66 is provided, it may be used for receiving solenoid coil 60'.

In the embodiment of FIG. 5, two variants of a layered design of hollow cylinder 30" are used, having plates of different relative dielectric constants $\in_r$.

In the upper part of FIG. 5, we have three such plates 70a, 70b and 70c, one actually besides another, and symmetric to a median plane 72. Middle plate 70a has a somewhat lower relative dielectric constant $\in_{r1}$ as compared to the two outer plates 70b and 70c having both the same, but slightly higher relative dielectric constant $\in_{r2}$.

In the lower part of FIG. 5, we have three plates 74a, 74b and 74c, one actually besides another, and there are air gaps 76a and 76b therebetween. Plates 74a, 74b and 74c, preferably, consist of the same material, i.e. they have the same relative dielectric constant $\in_r$.

Both variants shown in FIG. 5 have a predetermined function of the relative dielectric constant $\in_r$ along axis 22' and 22", respectively, effecting a homogenization of the magnetic high frequency field $B_1$ in that area.

What is claimed is:

1. A probe head for magic angle spinning nuclear magnetic resonance measurements, comprising a sample holder having a stator and a rotor, said rotor being journalled for rotation about an axis of rotation within said stator and being adapted for receiving a sample substance, said axis of rotation being inclined by a magic angle with respect to a longitudinal axis of said probe head, wherein said stator is configured as a dielectric resonator that is excited to produce a high frequency magnetic field in the sample substance.

2. The probe head of claim 1, wherein said dielectric resonator has essentially a shape of a hollow cylinder, an axis of which coinciding with said axis of rotation.

3. The probe head of claim 2, wherein said rotor has an essentially cylindrical rotational body extending along said axis of rotation, and being provided with an axial recess for receiving a sample arrangement.

4. The probe head of claim 3, wherein said sample arrangement is a sample container containing a sample substance.

5. The probe head of claim 3, wherein said sample arrangement is a sample substance.

6. A probe head for nuclear magnetic resonance measurements, comprising a sample holder having a stator and a rotor, said rotor being journalled for rotation about an axis of rotation within said stator and being adapted for receiving a sample substance, said axis of rotation being inclined by an angle with respect to a longitudinal axis of said probe head, wherein said stator is configured as a dielectric resonator having essentially a shape of a hollow cylinder, an axis of which coinciding with said axis of rotation and wherein said rotor has two turbine plates arranged along said axis of rotation with a distance between one another, said turbine plates being journalled within said dielectric resonator, and means being provided for feeding a bearing and driving gas to said turbine disks.

7. The probe head of claim 6, wherein said turbine plates are embedded in front surfaces of said hollow cylinder.

8. The probe head of claim 1, wherein means are provided for setting a resonance frequency of said dielectric resonator.

9. A probe head for nuclear magnetic resonance measurements, comprising a sample holder having a stator and a rotor, said rotor being journalled for rotation about an axis of rotation within said stator and being adapted for receiving a sample substance, said axis of rotation being inclined by an angle with respect to a longitudinal axis of said probe head, wherein said stator is configured as a dielectric resonator having essentially a shape of a hollow cylinder, an axis of which coinciding with said axis of rotation and wherein means are provided for setting a resonance frequency of said dielectric resonator, said means being configured as electrically conductive plates being adapted to be shifted along the front surfaces of said hollow cylinder relative to said axis of rotation.

10. A probe head for nuclear magnetic resonance measurements, comprising a sample holder having a stator and a rotor, said rotor being journalled for rotation about an axis of rotation within said stator and being adapted for receiving a sample substance, said axis of rotation being inclined by an angle with respect to a longitudinal axis of said probe head, wherein said stator is configured as a dielectric resonator and wherein said sample substance contains a first kind of nuclei having a first nuclear resonance frequency equal to a resonance frequency of said dielectric resonator, at least one transmitter/receiver unit being provided in said stator for irradiating a high frequency magnetic field of a second frequency equal to a second nuclear resonance frequency of a second kind of nuclei being likewise contained in said sample substance.

11. The probe head of claim 10, wherein said transmitter/receiver unit is configured as a solenoid coil, an axis of which coinciding with said axis of rotation.

12. The probe head of claim 2 or 11, wherein said solenoid coil is arranged in an interior space of said hollow cylinder.

13. The probe head of claim 2, wherein said solenoid coil is arranged in an interior space of said hollow cylinder, said solenoid coil being arranged in an inner recess applied to an inner peripheral surface of said hollow cylinder.

14. The probe head of claim 2, wherein an inner recess is applied to an inner peripheral surface of said hollow cylinder.

15. The probe head of claim 2, wherein an outer recess is applied to an outer peripheral surface of said hollow cylinder.

16. The probe head of claim 14, wherein an outer recess is applied to an outer peripheral surface of said hollow cylinder said inner and said outer recess being arranged flush one with the other.

17. The probe head of claim 1, wherein said stator is configured in layers along said axis of rotation, said layers being made of materials of different relative dielectric constants.

18. The probe head of claim 17, wherein said layers are arranged one besides the other, said layers consisting of either dielectric materials or of air.

19. The probe head of claim 17, wherein said stator is configured dielectrically symmetric to both sides starting from a radial median plane positioned at half of its length.

20. The probe head of claim 1, wherein said dielectric resonator is made from a ceramic material having a relative dielectric constant of more than 150.

21. The probe head of claim 20, wherein said dielectric resonator is made from a ceramic material having a relative dielectric constant of more than 400.

22. A probe head for nuclear magnetic resonance measurements, comprising a sample holder having a stator and a rotor, said rotor being journalled for rotation about an axis of rotation within said stator and being adapted for receiving a sample substance, said axis of rotation being inclined by an angle with respect to a longitudinal axis of said probe head, wherein said stator is configured as a dielectric resonator, said dielectric resonator is made from a ceramic material having a relative dielectric constant of more than 150 and said ceramic material is selected from the family of titanates.

23. The probe head of claim 22, wherein said ceramic material is barium titanate.

24. The probe head of claim 22, wherein said ceramic material is strontium titanate.

* * * * *

UNITED STATES PATENT AND TRADEMARK OFFICE
CERTIFICATE OF CORRECTION

PATENT NO. : 7,436,181 B2
APPLICATION NO. : 11/494265
DATED : October 14, 2008
INVENTOR(S) : Alexander Krahn, Peter Hoefer and Frank Engelke It is certified that error appears in the above-identified patent and that said Letters Patent is hereby corrected as shown below:

Page 1, Column 1:

Please insert --(73) Bruker BioSpin, GmbH; Rheinstetten-Furchheim (DE)--.

Signed and Sealed this

Thirteenth Day of January, 2009

JON W. DUDAS
*Director of the United States Patent and Trademark Office*